United States Patent
Logisch et al.

(10) Patent No.: US 7,360,139 B2
(45) Date of Patent: Apr. 15, 2008

(54) SEMICONDUCTOR COMPONENT, ARRANGEMENT AND METHOD FOR CHARACTERIZING A TESTER FOR SEMICONDUCTOR COMPONENTS

(75) Inventors: Andreas Logisch, München (DE); Mónica De Castro Martins, München (DE); Björn Flach, München (DE); Wolfgang Ruf, Friedberg (DE); Martin Schnell, München (DE); Ana Leao, Oporto (PT)

(73) Assignee: Infineon Technologies AG (DE)

( * ) Notice: Subject to any disclaimer, the term of this patent is extended or adjusted under 35 U.S.C. 154(b) by 154 days.

(21) Appl. No.: 11/257,401

(22) Filed: Oct. 25, 2005

(65) Prior Publication Data

US 2006/0156149 A1 Jul. 13, 2006

(30) Foreign Application Priority Data

Oct. 27, 2004 (DE) .................... 10 2004 052 246

(51) Int. Cl.
*G01R 31/28* (2006.01)
*G06F 11/00* (2006.01)

(52) U.S. Cl. .................................... 714/744
(58) Field of Classification Search ........... 714/724, 714/742, 744
See application file for complete search history.

(56) References Cited

U.S. PATENT DOCUMENTS 4,928,278 A * 5/1990 Otsuji et al. ............... 714/700
5,717,704 A * 2/1998 Rosenfeld .................. 714/736
6,192,496 B1 * 2/2001 Lawrence et al. .......... 714/724
6,363,507 B1 * 3/2002 Truebenbach et al. ...... 714/734
6,377,065 B1 * 4/2002 Le et al. .................... 324/765
6,567,941 B1 * 5/2003 Turnquist et al. .......... 714/724
6,897,646 B2   5/2005 Grebner et al.
7,106,081 B2 * 9/2006 Mayder et al. ............. 324/758
2002/0178409 A1  11/2002 Ostendorf et al.

FOREIGN PATENT DOCUMENTS

EP   0919823 A2   6/1999

* cited by examiner

*Primary Examiner*—James C. Kerveros
(74) *Attorney, Agent, or Firm*—Edell, Shapiro & Finnan, LLC

(57) ABSTRACT

A tester for semiconductor components with a plurality of channels is connected to a specific semiconductor component in order to characterize the signal path between tester and semiconductor component under production conditions. The specific semiconductor component includes measuring units that are connected to connection contacts and in each case provide the functionality of a signal generator, a signal detector, a digital communication interface and a receiving unit for trigger signals. The specific semiconductor component further includes a trigger logic to convey trigger signals between the receiving unit of a first one and the signal generator or detector of a second one of the measuring units.

27 Claims, 3 Drawing Sheets

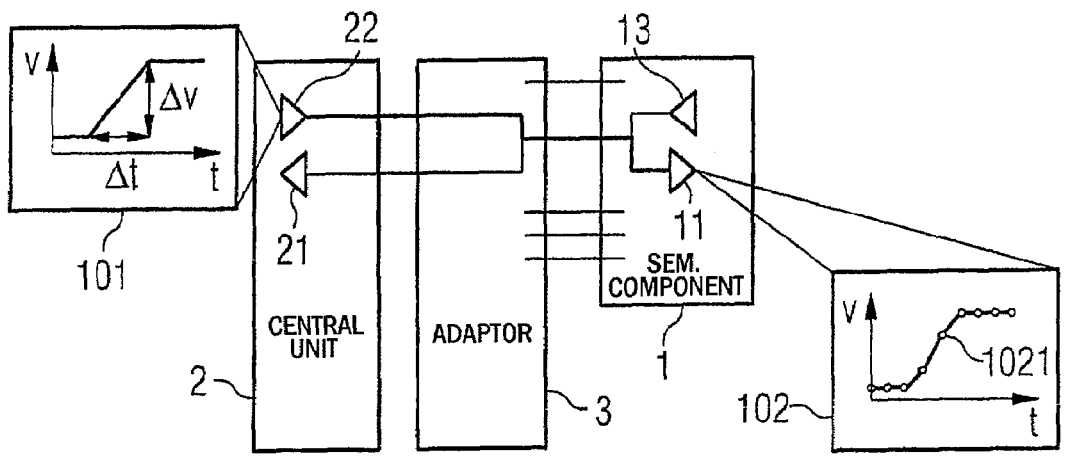
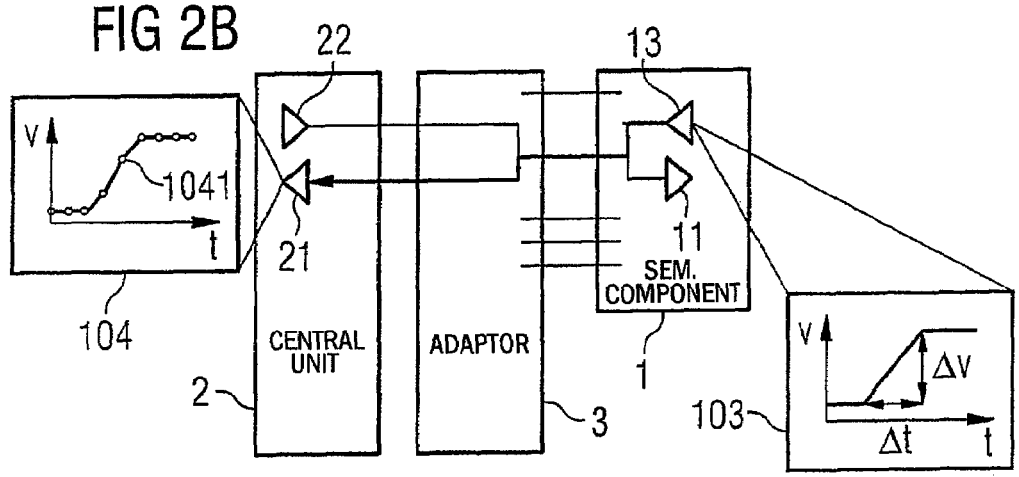
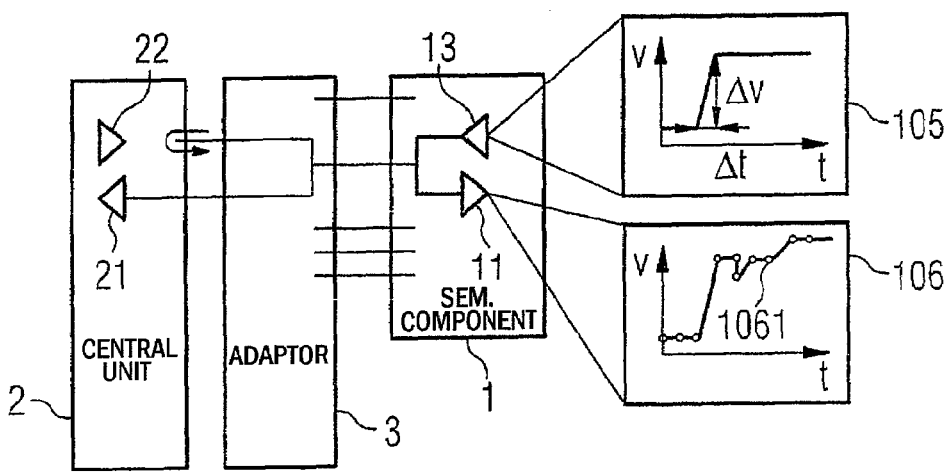

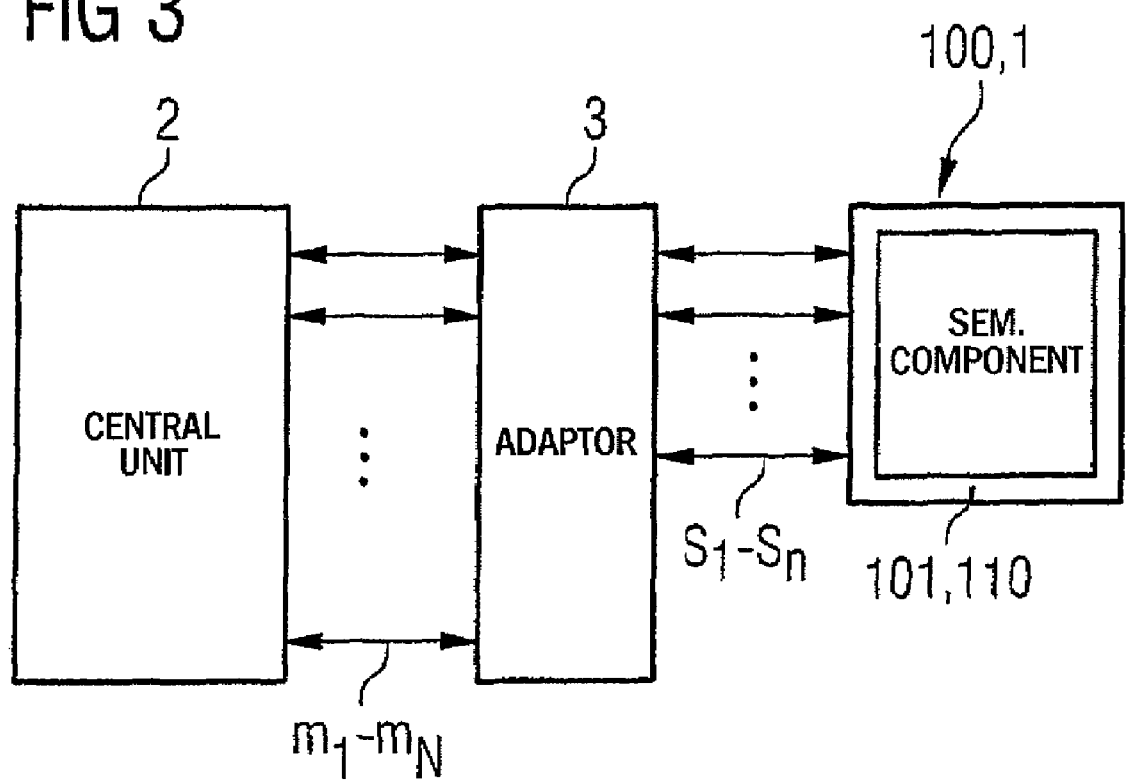

US 7,360,139 B2

SEMICONDUCTOR COMPONENT, ARRANGEMENT AND METHOD FOR CHARACTERIZING A TESTER FOR SEMICONDUCTOR COMPONENTS

CROSS-REFERENCE TO RELATED APPLICATIONS

This application claims priority under 35 U.S.C. §119 to German Application No. DE 10 2004 052 246.4, filed on Oct. 27, 2004 and titled "Semiconductor Component, Arrangement and Method for Characterizing a Tester for Semiconductor Components," the entire contents of which are hereby incorporated by reference.

FIELD OF THE INVENTION

The invention relates to a semiconductor component for determining the electrical properties of a tester for semiconductor components. The invention furthermore relates to an arrangement and a method for determining the electrical properties of a tester for semiconductor components using a semiconductor component.

BACKGROUND

Semiconductor components are typically subjected to a comprehensive functional test after their production. By way of example, the functional test for a dynamic random access memory comprises writing data to individual memory cells, reading out the data from the memory cells and comparing the written and read-out data. In order to carry out the functional test, the semiconductor component is connected to a tester with numerous channels for inputting and outputting signals. By way of example, a plurality of semiconductor components may in each case have a number of 64 connection contacts and the tester may have a number of 1024 channels. In this case, up to 16 of the semiconductor components can be connected to the tester.

The tester typically comprises a central unit (tester mainframe) and a component-specific adapter (HiFix). The central unit comprises, for example, the power supply, a programmable control unit for defining signal patterns, signal generators for generating output signals on the channels, signal detectors for detecting input signals via the channels, for example comparators for comparing voltage levels, oscilloscopes for representing input or output signals, and a standardized measuring head (test head) for inputting and outputting signals. The component-specific adapter comprises connection receptacles for a plurality of semiconductor components and connections for the standardized measuring head of the central unit. The component-specific adapter thus forms an interface between the central unit and generally a plurality of semiconductor components.

Since the clock frequencies and switching speeds of semiconductor components are constantly increasing, the requirements made of the measurement accuracy of a tester are also constantly increasing. In general, testers are therefore characterized with regard to their electrical properties both after purchase and during use in production. By way of example, the electrical properties of an individual signal driver can be determined by using an oscilloscope to graphically represent an output signal generated by the signal driver. In order to connect the oscilloscope, however, the arrangement has to be altered. Therefore, this method for characterizing an individual channel of the tester cannot be employed under production conditions. It is also possible to determine the electrical properties of a signal driver using a signal detector of the same channel. However, no semiconductor component is connected to the tester, so that the electrical properties determined by the characterization do not describe the signal path occurring under production conditions. The different sections of the signal path from the tester via the component-specific adapter to the semiconductor component can also be characterized independently of one another with regard to their electrical properties. In this case, however, the connection conditions that are predetermined by the remaining sections of the signal path under production conditions are disregarded in each case. In particular, the influence of the housing of a semiconductor component is not taken into account. Therefore, the electrical properties of the signal path present under production conditions cannot be determined by characterization of the individual sections.

To summarize, it can be stated that the characterization of testers according to the prior art does not include the entire signal path between the semiconductor component to be tested and the tester such as is present under production conditions.

SUMMARY

An object of the invention is to provide a tester configured in such a manner that the resistive, capacitive and inductive properties of the entire signal path between a semiconductor component to be tested and the tester are considered.

The above and further objects are achieved in accordance with the invention by providing a semiconductor component comprising a plurality of connection contacts, a control device with a processor, a clock generator and a memory, a data and command bus, to which the control device is connected, a plurality of measuring units, which are in each case connected to the data and command bus, and a trigger logic. A respective one of the measuring units is connected to an assigned one of the connection contacts and to the data and command bus and comprises a sampling unit to sample an input signal applied via the assigned one of the connection contacts, a communication unit to exchange digital data via the assigned one of the connection contacts, a signal generator to generate an output signal at the assigned one of the connection contacts and a receiving unit to detect an external trigger signal applied via the assigned one of the connection contacts. The trigger logic includes a plurality of inputs and a plurality of outputs. A respective one of the inputs is connected to the receiving unit of a respective one of the measuring units while bypassing the data and command bus, and a respective one of the outputs is connected to the sampling unit and to the signal generator of a respective one of the measuring units while bypassing the data and command bus.

Thus, a specific semiconductor component is used to characterize the channels of a tester. The semiconductor component is programmable and flexibly configurable. All the measuring units have the same functionality and can in each case be used to sample an input signal, to generate an output signal, to detect a trigger signal or to exchange digital data. As a result, it is possible, by way of example, to select one of the measuring units that is connected to a first one of the channels of the tester to exchange digital data with the tester, one of the measuring units that is connected to a second one of the channels of the tester to characterize this channel, and one of the measuring units that is connected to a third one of the channels of the tester to detect an external trigger signal. The trigger logic is connected to the measuring units via separate lines while bypassing the data and command bus, since the triggering is time-critical and delays can occur during the data transmission on the data and command bus. The housing of the semiconductor component according to the invention is identical to the housing of a conventional semiconductor component connected to the component-specific adapter under production conditions. In this way, the effect of the housing and of the terminal connections is also taken into account in the characterization of the tester.

The communication unit of a first one of the measuring units can preferably be selected by the processor to exchange the digital data. A setting value read out from the digital data by the communication unit of the first one of the measuring units can be written to the memory by the processor and a sequence of samples written to the memory can be communicated to the communication unit by the processor.

For exchanging the digital data, an arbitrary one of the measuring units can be selected by the processor by a power-up sequence. The power-up sequence is stored in the BIOS of the memory and is executed if the semiconductor component is connected to a power supply.

The sampling unit of a second one of the measuring units can preferably be selected by the processor to generate the sequence of samples. The sampling unit of the second one of the measuring units is connected to the data and command bus. The sequence of samples can be written to the memory by the processor via the data and command bus.

The sampling unit of the second one of the measuring units preferably includes a buffer memory. The sequence of samples can be stored in the buffer memory and can be read out by the processor via the data and command bus. In this way, an input signal can be sampled with a higher sampling rate.

A storage of the sequence of samples in the buffer memory of the sampling unit of the second one of the measuring units can preferably be triggered by a trigger signal proceeding from the connected one of the outputs of the trigger logic. The trigger signal thus serves only for triggering the sampling of an input signal with a high sampling rate.

A sampling rate of the sampling unit of the second one of the measuring units can preferably be set by the processor via the data and command bus and is preferably defined by the setting value written to the memory.

The signal generator of a third one of the measuring units can preferably be selected to generate the output signal. The output signal can preferably be set by the processor and is preferably defined by the setting value written to the memory. The signal shape of the output signal is thus programmable.

The generated output signal preferably includes an edge. The gradient of the edge is preferably defined by the setting value written to the memory.

The signal generator of a fourth one of the measuring units can preferably be selected by the processor to generate a DC voltage. A level of the DC voltage can preferably be set by the processor via the data and command bus and is preferably defined by the setting value written to the memory.

The level of the DC voltage is thus programmable. The predefinition of a voltage level by the semiconductor component with a subsequent measurement of the voltage level by the tester serves for finding poorly conductive terminal connections.

A generation of the output signal by the signal generator of the fourth one of the measuring units can preferably be triggered by a trigger signal proceeding from the connected one of the outputs of the trigger logic. The trigger signal thus serves only to trigger the generation of the output signal.

The trigger logic is preferably connected to the data and command bus. At least one of the outputs can be assigned to a respective one of the inputs. The at least one of the outputs can preferably be selected by the processor and is preferably defined by the setting value written to the memory. It is possible for a trigger signal proceeding from the at least one of the outputs to be generated by a trigger signal arriving at the respective one of the inputs.

The receiving unit of a fifth one of the measuring units can preferably be selected by the processor to detect the external trigger signal. By the trigger signal, the incoming trigger signal can be generated at the connected one of the inputs of the trigger logic.

The memory of the control device preferably comprises a first memory providing read-only access and a second memory providing reading and writing access. A program to select the first one of the measuring units, which program can be executed by the processor, is preferably stored in the first memory. An execution of the program can preferably be triggered by the application of a supply voltage.

The arrangement according to the invention comprises a tester for semiconductor components and a semiconductor component according to the invention. The tester includes a plurality of channels to generate and detect signals and an adapter specific to a housing of the semiconductor components. The semiconductor component according to the invention includes a housing that can be connected to the adapter, it being possible for a respective one of the connection contacts of the semiconductor component according to the invention to be connected to one of the channels of the tester.

A method according to the invention comprises a step of providing the arrangement according to the invention, a step of connecting the semiconductor component according to the invention to the adapter of the tester, a respective one of the measuring units being connected to one of the channels of the tester via the corresponding one of the connection contacts, a step of selecting the communication unit of a first one of the measuring units by the processor, a step of selecting the sampling unit of a second one of the measuring units by the processor, a step of applying an input signal at one of the connection contacts that is connected to the second one of the measuring units, a step of sampling the input signal and generating a sequence of samples, representing the input signal, by the sampling unit of the second one of the measuring units, a step of writing a sequence of samples to the memory by the processor, a step of reading-out the sequence of samples from the memory and communicating the sequence of samples to the communication unit of the first one of the measuring units by the processor, and a step of communicating the sequence of samples by the communication unit of the first one of the measuring units to the one of the channels of the tester which is connected to the first one of the measuring units.

The method according to the invention preferably comprises a step of detecting a setting value communicated via the connected one of the channels by the communication unit of the first one of the measuring units, and a step of transferring the setting value by the processor from the communication unit of the first one of the measuring units to the memory.

The method according to the invention preferably comprises a step of selecting the signal generator of a third one of the measuring units, a step of reading-out the setting value from the memory by the processor, a step of defining a time profile for the output signal in a manner dependent on the setting value, and a step of generating the output signal by the signal generator of the third one of the measuring units.

The step of generating the output signal preferably comprises a step of generating the output signal with an edge, and a step of setting of a gradient of the edge in a manner dependent on the setting value.

The method according to the invention preferably comprises a step of selecting the signal generator of a fourth one of the measuring units by the processor to generate a DC voltage with a fixed level, and a step of setting of the level in a manner dependent on the setting value.

The method according to the invention preferably comprises a step of selecting the receiving unit of a fifth one of the measuring units to detect the external trigger signal, a step of generating an incoming trigger signal for the trigger logic by the receiving unit of the fifth one of the measuring units, a step of receiving the incoming trigger signal and generating an outgoing trigger signal by the trigger logic, and a step of triggering the sampling of the input signal by the outgoing trigger signal.

The method according to the invention preferably comprises a step of triggering the generation of the output signal by the outgoing trigger signal.

The method according to the invention preferably comprises a step of reflecting the output signal along a signal path between the semiconductor component according to the invention and the tester for the application of the input signal.

In particular, an arbitrary one of the measuring units can be selected as the third one and the second one of the measuring units and both generate the output signal and sample the input signal. In this case, the input signal is effected by reflection of the output signal along the signal path.

The method according to the invention preferably comprises a step of generating a sequence of output signals in a manner dependent on a sequence of trigger signals by the signal generator of the third one of the measuring units, a respective one from the sequence of output signals being generated for a respective one from the sequence of trigger signals, and a step of measurement of the sequence of output signals by the tester, it being determined for the respective one from the sequence of output signals, after a delay which is related to the respective one from the sequence of trigger signals and is in each case set anew, whether or not a signal level exceeds a predetermined threshold value.

In the case of testers without a sampling function, a sequence of identical edge signals can be communicated from the semiconductor component to the tester, a level value being determined for a respective one of the edge signals and the instant for determining the level value in each case being chosen such that, by the level values of all the edge signals, a sequence of samples is defined for one of the edge signals.

The method according to the invention preferably comprises a step of selecting a sixth one of the measuring units by the processor, a step of generating a further input signal at the one of the connection contacts that is connected to the sixth one of the measuring units, the input signal and the further input signal being generated by a signal applied simultaneously by the tester via the one of the channels that is connected to the first one and the sixth one of the measuring units, a step of generating a further sequence of samples, representing the further input signal, by the sampling unit of the sixth one of the measuring units, a step of storing the further sequence of samples in the memory by the processor, and a step of determining a delay between the input signal and the further input signal.

It is thus possible to use two of the measuring units to determine a propagation time difference between two signal paths.

The step of selecting the first one of the measuring units preferably comprises a step of automatic loading of a program to select the first one of the measuring units, said program being stored in the memory, the automatic loading being triggered by the step of connecting the semiconductor component according to the invention to the adapter, a step of application of a low voltage level to the connection contacts by the tester, a step of detection of the low voltage level by the processor, a subsequent step of application of a high voltage level to a first one of the connection contacts by means of the tester, a step of detection of the high and low voltage levels applied to the connection contacts by the processor, and a step of selecting the one of the measuring units that is connected to the first one of the connection contacts as the first one of the measuring units.

The selection of the communication units is thus controlled by the BIOS stored in the first memory and is triggered by the connection of the semiconductor component to the power supply. Afterward, via the communication unit of one of the measuring units that is selected for communication, it is possible to set up a connection, to negotiate a protocol and to load a measurement program.

The, above and still further objects, features and advantages of the present invention will become apparent upon consideration of the following detailed description of specific embodiments thereof, particularly when taken in conjunction with the accompanying drawings where like numerals designate like components.

BRIEF DESCRIPTION OF THE FIGURES

FIGS. 2A to 2C illustrate exemplary measurement operations for characterizing a tester according to the present invention.

FIG. 3 shows an exemplary embodiment of an arrangement for characterizing a tester according to the present invention.

DETAILED DESCRIPTION

Figure 1A:
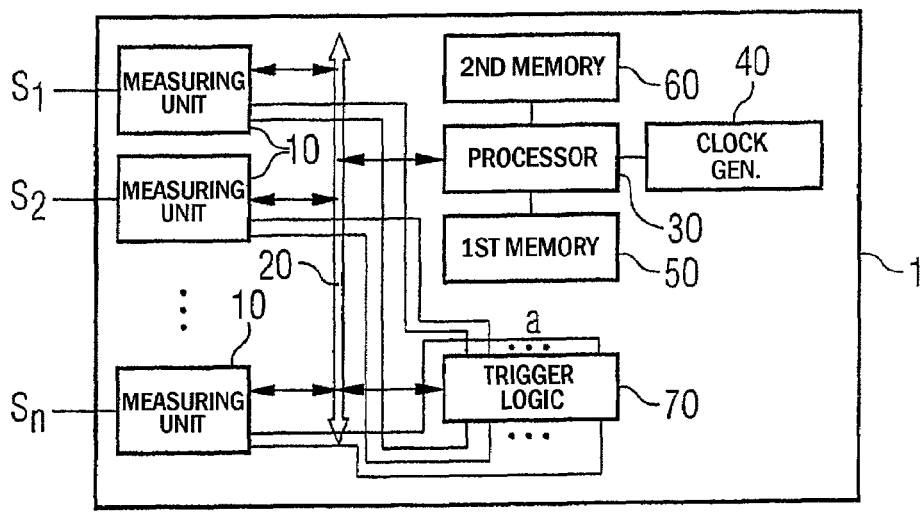
FIG. 1A shows an exemplary embodiment of the circuit of a semiconductor component according to the present invention.

FIG. 1A illustrates an exemplary embodiment of the circuit of the semiconductor component according to the invention. Contact can be made with the connection contacts $s_1$ to $s_n$ from outside the housing. The semiconductor component 1 contains a plurality of measuring units 10 each providing the same functionality, a data and command bus 20, a processor 30, a clock generator 40, a first memory for read-only access 50, a second memory 60 for reading and writing access, and a trigger logic 70. A respective one of the measuring units 10 is connected to a respective corresponding one of the connection contacts $s_1$ to $s_n$ and to the data and command bus 20. The processor 30 is connected to the data and command bus 20 and also to the clock generator 40, the first memory 50 and the second memory 60. As can be seen in FIG. 1C, the trigger logic 70 includes a plurality of inputs $t_{11}$ to $t_{1n}$ and a plurality of outputs $t_{21}$ to $t_{2n}$. The number of inputs $t_{11}$ to $t_{1n}$ and the number of outputs $t_{21}$ to $t_{2n}$ in each case correspond with the number n of measuring units 10. A respective one of the inputs $t_{11}$ to $t_{1n}$ and a respective one of the outputs $t_{21}$ to $t_{2n}$ are connected to a respective one of the measuring units 10. Utilizing the processor 30, data stored in the first memory 50 and in the second memory 60 can be read out and communicated to a respective one of the measuring units 10 via the data and command bus 20. Moreover, utilizing the processor 30, data can be read out from the respective one of the measuring units 10 and be written to the second memory 60. The data that are read out from the respective one of the measuring units 10 and communicated to the memory 60 and also the data that are read out from the memory 60 and communicated to the respective one of the measuring units 10 may contain, for example, a sequence of samples or a setting value.

Figure 1B:
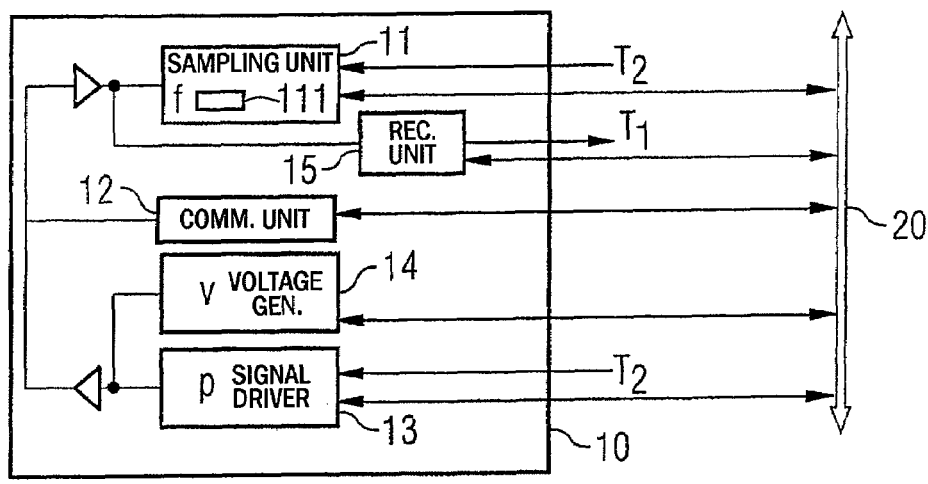
FIG. 1B shows an exemplary embodiment of the circuit of one of the measuring units of the semiconductor component according to the present invention.
Figure 1C:
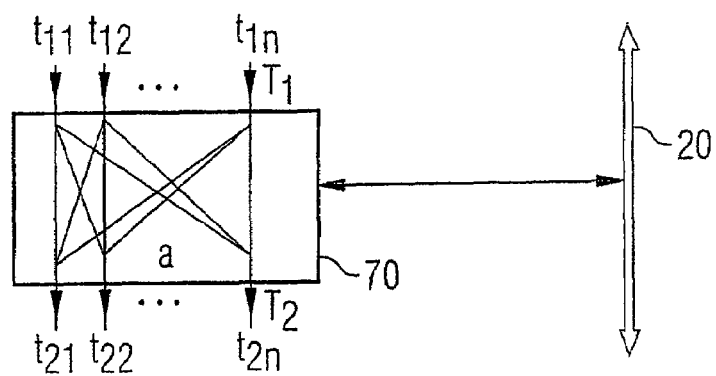
FIG. 1C shows an exemplary embodiment of the circuit of the trigger logic of the semiconductor component according to the present invention.

FIG. 1B illustrates an exemplary embodiment of the circuit of one of the measuring units 10. Each of the measuring units 10 contains a sampling unit 11, a communication unit 12, a signal driver 13, a DC voltage generator 14 and a receiving unit 15 for trigger signals.

The sampling unit 11 is connected, on the input side, to the one of the connection contacts $s_1$ to $s_n$ that corresponds to the one of the measuring units 10 and, on the output side, to the data and command bus 20. Moreover, the sampling unit 11 is connected to one of the outputs $t_{21}$ to $t_{2n}$ of the trigger logic 70. The sampling unit contains a buffer memory 111. The sampling rate f for the sampling of an input signal is adjustable. If the sampling unit 11 receives a trigger signal $T_2$ from the trigger logic, then an input signal present on the input side is sampled at the sampling rate f. The sampling rate f is adjustable and can be predefined by the processor 30 via the data and command bus. A sequence of samples obtained as a result of the sampling is stored in the buffer memory 111. Afterward, the sequence of samples is read out by the processor 30 via the data and command bus 20 and stored in the second memory 60.

A typical value for the sampling rate corresponds to a temporal resolution of 50 ps. A typical value for the resolution of the voltage is 50 mV.

The signal driver 13 and the DC voltage generator 14 are connected, on the output side, to the one of the connection contacts $s_1$ to $s_n$ that corresponds to the one of the measuring units 10 and, on the input side, to the data and command bus 20. Moreover, the signal driver 13 is connected to one of the outputs $t_{21}$ to $t_{2n}$ of the trigger logic 70. The signal shape, for example an edge with a selectable gradient, that is to say a selectable rise time of the level, of an output signal that can be generated by the signal driver 13 can be set by a parameter p and can be predefined by the processor 30 via the data and command bus 20. Likewise, the level v of an output signal that can be generated by the DC voltage generator 14 can be set and can be predefined by the processor 30 via the data and command bus 20. If the signal driver 13 receives a trigger signal $T_2$ from the trigger logic, then an output signal with the set signal shape is generated on the output side.

A typical value for the tracking time of an output signal generated by the signal driver 13 corresponds to an edge gradient of 10 V/ns. A typical temporal resolution for a generated output signal is 50 ps.

The communication unit 12 is connected to the one of the connection contacts $s_1$ to $s_n$ that corresponds to the one of the measuring units 10, and the communication unit 12 is further connected to the data and command bus 20. The communication unit 12 can be selected for communication by the processor 30. If the communication unit 12 is selected for communication, then the processor 30 may communicate a sequence of samples to the communication unit 12, which the latter outputs according to a defined digital protocol via the corresponding one of the connection contacts $s_1$ to $s_n$ to one of the channels of the connected tester. Moreover, the communication unit 12 may receive a setting value, for example for the sampling rate f, the parameter p or the level v, in digital form via the one of the channels of the connected tester and the corresponding one of the connection contacts $s_1$ to $s_n$. The setting value may be read out by the processor 30 and be stored in the second memory 60 or be communicated directly to the sampling unit 11 or the signal driver 13 or the DC voltage generator 14, respectively.

The receiving unit 15 for trigger signals is connected, on the input side, to the one of the connection contacts $s_1$ to $s_n$ which corresponds to the one of the measuring units 10 and, on the output side, to one of the inputs $t_{11}$ to $t_{1n}$ of the trigger logic 70. Moreover, the receiving circuit 15 is connected to the data and command bus 20 and can be selected by the processor 30 to detect a trigger signal. If the receiving circuit 15 is selected by the processor 30 to detect a trigger signal, then an external trigger signal applied to the corresponding one of the connection contacts $s_1$ to $s_n$ is detected and a corresponding trigger signal $T_1$ is generated at the connected one of the inputs $t_{11}$ to $t_{1n}$ of the trigger logic 70.

FIG. 1C illustrates an exemplary embodiment of the circuit of the trigger logic 70. The trigger logic 70 includes a plurality of inputs $t_{11}$ to $t_{1n}$ and a plurality of outputs $t_{21}$ to $t_{2n}$. The number of inputs $t_{11}$ to $t_{1n}$ and the number of outputs $t_{21}$ to $t_{2n}$ in each case correspond to the number of measuring units 10. The outputs are connected to the inputs via cross-connection switches, so that a respective one of the inputs $t_{11}$ to $t_{1n}$ can be assigned to one or more of the outputs $t_{21}$ to $t_{2n}$. The trigger logic 70 is connected to the data and command bus 20. One of the outputs $t_{21}$ to $t_{2n}$ can be assigned to a respective one of the inputs $t_{11}$ to $t_{1n}$ by the processor 30, the first one of the inputs $t_{11}$ to $t_{1n}$ being connected to the assigned ones of the outputs $t_{21}$ to $t_{2n}$ via the cross-connection switches. A trigger signal $T_1$ applied to the respective one of the inputs $t_{11}$ to $t_{1n}$ generates a corresponding trigger signal $T_2$ at the assigned one of the outputs $t_{21}$ to $t_{2n}$.

A method for characterizing a channel of a tester according to the present invention is illustrated with reference to FIGS. 2A to 2C. The tester includes a central unit 2 (tester mainframe) and a component-specific adapter 3 (HiFix). The central unit 2 includes, for example, the power supply, a programmable control unit to define signal patterns, signal generators to generate output signals on the channels, signal detectors to detect input signals via the channels (e.g., comparators to compare voltage levels), oscilloscopes to represent input or output signals, and a standardized measuring head (Test Head) to input and output signals. The component-specific adapter 3 includes connection receptacles for a plurality of semiconductor components and connections for the standardized measuring head of the central unit. The component-specific adapter 3 thus forms an interface between the central unit and a plurality of semiconductor components.

FIG. 2A illustrates the characterization of the signal path between a signal driver 22 of a channel of the tester and a sampling unit 11 of one of the measuring units 10. The tester generates a trigger signal. Triggered by the trigger signal, the signal driver 22 generates the output signal 101, which effects a corresponding input signal 102 at the sampling unit 11. The output signal 101 contains, for example, an edge having the gradient $\Delta v/\Delta t$. The input signal 102 contains a distorted image of the edge. The trigger signal generated by the tester is detected by the receiving unit 15 of another of the measuring units 10 and communicated to the sampling unit 11 via the trigger logic 70. Triggered by the communicated trigger signal, the sampling unit 11 samples the input signal 102 and generates a sequence of samples 1021 in the buffer memory 111. Afterward, the sequence of samples 1021 is read out from the buffer memory 111 by the processor 30 and transferred into the second memory 60. The sequence of samples 1021 can be read out of the memory 60 by the processor 30 and communicated via the communication unit 12 of one of the measuring units 10 to a device suitable for evaluating the data, in particular to the tester.

FIG. 2B illustrates the characterization of the signal path between a signal detector 21 of a channel of the tester and the signal driver 13 of one of the measuring units 10. The tester generates a trigger signal. The trigger signal generated by the tester is detected by the receiving unit of another of the measuring units 10 and communicated to the signal driver 13 via the trigger logic 70. Triggered by the trigger signal, the signal driver 13 generates the output signal 103, which effects a corresponding input signal 104 at the signal detector 21. The output signal 103 contains, for example, an edge having the gradient $\Delta v/\Delta t$. The input signal 104 contains a distorted image of the edge. Triggered by the trigger signal, the signal detector 21 samples the input signal 104 and generates a sequence of samples 1041 in a memory of the tester.

FIG. 2C illustrates the characterization of the signal path between the signal driver 13 and the sampling unit 11 of one of the measuring units 10 by an electromagnetic signal reflected along the electrical connection between the semiconductor component and the tester. The tester generates a trigger signal. The trigger signal generated by the tester is detected by the receiving unit of another of the measuring units 10 and communicated via the trigger logic 70 to the signal driver 13 and to the sampling unit 11. Triggered by the trigger signal, the signal driver 13 generates the output signal 105, which is reflected at locations along the signal path at which the impedance changes, and effects a corresponding input signal 106 at the sampling unit 11. The output signal 105 contains, for example, an edge having the gradient $\Delta v/\Delta t$. The input signal 106 contains a distorted image of the edge. Triggered by the trigger signal, the sampling unit 11 samples the input signal 106 and generates a sequence of samples 1061 in the buffer memory 111. Afterward, the sequence of samples 1061 is read out from the buffer memory 111 by the processor 30 and is transferred into the second memory 60. The sequence of samples 1061 can be read out from the memory 60 by the processor 30 and communicated via the communication unit 12 of one of the measuring units 10 to a device suitable for evaluating the data, in particular to the tester. From the measurement of the input signal 106 with knowledge of the output signal 105, it is possible to determine a short circuit, a line interruption, a local change in the capacitive or inductive load along the signal path and to localize it by the delay governed by the propagation time.

FIG. 3 illustrates an exemplary embodiment of an arrangement for characterizing a tester according to the present invention. The central unit 2 of the tester includes a standardized measuring interface with a plurality of measuring channels $m_1$ to $m_N$. The component-specific adapter 3 includes connection receptacles with receptacle contacts specific to a housing of a semiconductor component. The conventional semiconductor component 100 and the semiconductor component 1 according to the invention can be connected to the tester via the same connection receptacle of the component-specific adapter 3. It is possible, therefore, to connect, for example, 16 semiconductor components 1 according to the invention, each having 64 connection contacts, via 16 connection receptacles of the component-specific adapter 3 in order to characterize a tester having 1024 channels for inputting and outputting signals.

The characterization of the conventional semiconductor components 100 under production conditions is carried out at different temperatures. For this purpose, the component-specific adapter 3 is introduced into a temperature chamber. The signal path between the central unit 2 of the tester and the semiconductor component 1 according to the invention during the characterization of the tester is intended to be as similar as possible to the signal path present under production conditions between the central unit 2 of the tester and the conventional semiconductor component 100. It may therefore be expedient to carry out the characterization of the tester while the component-specific adapter 3 with the semiconductor components according to the invention is introduced into the temperature chamber and exposed to the conditions present during the characterization of the conventional components.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is Claimed:

1. A semiconductor component comprising:
   a plurality of connection contacts;
   a control device comprising a processor, a clock generator and a memory module;
   a data and command bus to which the control device is connected;
   a plurality of measuring units, each measuring unit being connected to a respective connection contact and to the data and command bus, each measuring unit further including a sampling unit to sample an input signal applied via the respective connection contact, a communication unit to exchange digital data via the respective connection contact, a signal generator to generate an output signal at the respective connection contact, and a receiving unit to detect an external trigger signal applied via the respective connection contact; and
   a trigger logic module including a plurality of inputs and a plurality of outputs, each input being connected to the receiving unit of a respective measuring unit while bypassing the data and command bus, and each output being connected to the sampling unit and the signal generator of the respective measuring unit while bypassing the data and command bus;

wherein the semiconductor component is configured to determine electrical properties of a tester, the tester being configured to test properties of other semiconductor components.

2. The semiconductor component of claim 1, wherein the communication unit of a first one of the measuring units is configured to exchange digital data of the semiconductor component, a setting value received from the digital data is written to the memory module of the control device by the processor, and a sequence of samples written to the memory module is communicated to the communication unit of the first one of the measuring units by the processor.

3. The semiconductor component of claim 2, wherein the sampling unit of a second one of the measuring units is configured to generate the sequence of samples from the input signal, and the sequence of samples are written to the memory module of the control device by the processor via the data and command bus.

4. The semiconductor component of claim 3, wherein the sampling unit of the second one of the measuring units includes a buffer memory module that stores the sequence of samples to be read by the processor via the data and command bus.

5. The semiconductor component of claim 4, wherein the semiconductor component is further configured such that storage of the sequence of samples in the buffer memory module of the sampling unit of the second one of the measuring units is triggered by a trigger signal provided by the respective one of the outputs of the trigger logic module that is connected to the sampling unit of the second one of the measuring units.

6. The semiconductor component of claim 3, wherein a sampling rate of the sampling unit of the second one of the measuring units is defined by a setting value.

7. The semiconductor component of claim 3, wherein the signal generator of a third one of the measuring units is configured to generate the output signal, and a time profile of the output signal is defined by a setting value.

8. The semiconductor component of claim 7, wherein the output signal has an edge, and a gradient of the edge is defined by the setting value.

9. The semiconductor component of claim 7, wherein the semiconductor component is further configured such that generation of the output signal by the signal generator of the third one of the measuring units is triggered by a trigger signal provided by the respective one of the outputs of the trigger logic module.

10. The semiconductor component of claim 3, wherein the signal generator of a fourth one of the measuring units is configured to generate a DC voltage, and a level of the DC voltage is defined by a setting value.

11. The semiconductor component of claim 10, wherein the semiconductor component is further configured such that the receiving unit of a fifth one of the measuring units is selected by the processor to detect the external trigger signal and an incoming trigger signal is generated by the external trigger signal at a respective input of the trigger logic that is connected to the receiving unit of the fifth one of the measuring units.

12. The semiconductor component of claim 11, wherein the memory module of the control device comprises a first memory module configured to provide read-only access and a second memory module configured to provide reading and writing access, the processor is configured to execute a program that selects the first one of the measuring units and stores data in the first memory module, and execution of the program is triggered by application of a supply voltage.

13. The semiconductor component of claim 3, wherein the trigger logic module is connected to the data and command bus and is configured to assign at least one of the outputs to a respective input, the at least one of the outputs being defined by a setting value, and the semiconductor component is further configured such that a trigger signal that is provided from the at least one of the outputs is generated by a trigger signal arriving at the respective input.

14. The semiconductor component of claim 1, wherein the plurality of connection contacts are configured to connect, via an adaptor, with corresponding channels of the tester.

15. The semiconductor component of claim 1, wherein each measuring unit of the semiconductor component is connected to the trigger logic module.

16. An arrangement for characterizing a tester for semiconductor components, comprising:
a tester to test semiconductor components, the tester comprising a plurality of channels to generate and detect signals and an adapter specific to a housing of the semiconductor components; and
a testing semiconductor component that is configured to determine electrical properties of the tester, the testing semiconductor component comprising:
a plurality of connection contacts;
a control device comprising a processor, a clock generator and a memory module;
a data and command bus to which the control device is connected;
a plurality of measuring units, each measuring unit being connected to a respective connection contact and to the data and command bus, each measuring unit further including a sampling unit to sample an input signal applied via the respective connection contact, a communication unit to exchange digital data via the respective connection contact, a signal generator to generate an output signal at the respective connection contact, and a receiving unit to detect an external trigger signal applied via the respective connection contact;
a trigger logic module including a plurality of inputs and a plurality of outputs, each input being connected to the receiving unit of a respective measuring unit while bypassing the data and command bus, and each output being connected to the sampling unit and the signal generator of the respective measuring unit while bypassing the data and command bus; and
a housing that is connectable to the adapter so as to connect each connection contact of the semiconductor component to a respective channel of the tester.

17. A method for characterizing a tester for semiconductor components, comprising:
providing an arrangement, the arrangement comprising a tester to test semiconductor components, the tester comprising a plurality of channels to generate and detect signals and an adapter specific to a housing of the semiconductor components, and a testing semiconductor component that is configured to determine electrical properties of the tester, the testing semiconductor component comprising a plurality of connection contacts, a control device comprising a processor, a clock generator and a memory module, a data and command bus to which the control device is connected, a plurality of measuring units, each measuring unit being connected to a respective connection contact and to the data and command bus, each measuring unit further including a sampling unit to sample an input signal applied via the respective connection contact, a communication unit to exchange digital data via the respective connection contact, a signal generator to generate an output signal at the respective connection contact, and a receiving unit to detect an external trigger signal applied via the respective connection contact, a trigger logic module including a plurality of inputs and a plurality of outputs, each input being connected to the receiving unit of a respective measuring unit while bypassing the data and command bus, and each output being connected to the sampling unit and the signal generator of the respective measuring unit while bypassing the data and command bus, and a housing that is connectable to the adapter so as to connect each connection contact of the semiconductor component to a respective channel of the tester;

connecting the testing semiconductor component to the adapter such that each measuring unit is connected to a respective channel of the tester via the respective connection contact;

selecting the communication unit of a first one of the measuring units by the processor;

selecting the sampling unit of a second one of the measuring units by the processor;

applying the input signal at the respective connection contact that is connected to the second one of the measuring units;

sampling the input signal and generating the sequence of samples;

representing the input signal, by the sampling unit of the second one of the measuring units;

writing a sequence of samples to the memory module by the processor;

reading-out the sequence of samples from the memory module and communicating the sequence of samples to the communication unit of the first one of the measuring units by the processor; and communicating the sequence of samples by the communication unit of the first one of the measuring units to the respective channel of the tester that is connected to the first one of the measuring units.

18. The method of claim 17, further comprising:

detecting a setting value by the communication unit of the first one of the measuring units; and transferring the setting value by the processor from the communication unit of the first one of the measuring units to the memory module.

19. The method of claim 18, further comprising:

selecting a third one of the measuring units by the processor;

reading-out the setting value from the memory module by the processor;

defining a time profile for the output signal by the setting value; and generating the output signal by the signal generator of the third one of the measuring units in a manner dependent on the setting value.

20. The method of claim 19, wherein the step of generating the output signal comprises:

generating the output signal with an edge;

setting of a gradient of the edge in a manner dependent on the setting value.

21. The method of claim 20, further comprising:

selecting the signal generator of a fourth one of the measuring units to generate a DC voltage with a set level; and setting the level in a manner dependent on the setting value.

22. The method of claim 21, further comprising:

selecting the receiving unit of a fifth one of the measuring units so as to detect the external trigger signal and generate an incoming trigger signal for the trigger logic;

receiving the incoming trigger signal and generating the outgoing trigger signal by the trigger logic; and triggering the sampling of the input signal by the outgoing trigger signal.

23. The method of claim 22, further comprising:

triggering the generation of the output signal via the outgoing trigger signal.

24. The method of claim 19, further comprising:

generating the input signal by reflection of the output signal along a signal path between the testing semiconductor component and the tester.

25. The method of claim 21, further comprising:

generating a sequence of output signals in a manner dependent on a sequence of trigger signals by the signal generator of the third one of the measuring units, wherein a respective one from the sequence of output signals is generated for a respective one from the sequence of trigger signals; and measuring the sequence of output signals by the tester, wherein the respective one from the sequence of output signals is ascertained, after a delay that is related to the respective one from the sequence of trigger signals and is in each case set anew, whether or not a signal level exceeds a predetermined threshold value.

26. The method of claim 18, further comprising:

selecting a sixth one of the measuring units by the processor;

generating a further input signal at the connection contact that is connected to the sixth one of the measuring units, wherein the input signal and the further input signal are generated by a signal applied simultaneously by the tester via the channel that is connected to the first one and the sixth one of the measuring units;

generating a further sequence of samples, representing the further input signal, by the sampling unit of the sixth one of the measuring units;

writing of the further sequence of samples to the memory module by the processor; and determining a delay between the input signal and the further input signal.

27. The method of claim 18, wherein the step of selecting the communication unit of a first one of the measuring units by the processor comprises:

automatically loading of a program for selecting the communication unit of the first one of the measuring units, wherein the program is stored in the memory module, and the automatic loading is triggered by the step of connecting the testing semiconductor component to the adapter;

applying a low voltage level to the connection contacts by the tester;

detecting the low voltage level applied to the connection contacts by the processor;

applying a high voltage level to a first one of the connection contacts by the tester;

detecting the high and low voltage levels applied to the connection contacts by the processor; and selecting the measuring unit that is connected to the first one of the connection contacts as the first one of the measuring units.

* * * * *